(12) United States Patent
Chang (10) Patent No.: US 12,347,766 B2
(45) Date of Patent: Jul. 1, 2025

(54) SEMICONDUCTOR STRUCTURE AND METHOD FOR FORMING THE SAME

(71) Applicant: Winbond Electronics Corp., Taichung (TW)

(72) Inventor: Hao-Chuan Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 587 days.

(21) Appl. No.: 17/590,293

(22) Filed: Feb. 1, 2022

(65) Prior Publication Data
US 2023/0275017 A1 Aug. 31, 2023

(51) Int. Cl.
*H01L 23/522* (2006.01)
*H01L 21/768* (2006.01)
*H01L 23/532* (2006.01)
*H10B 12/00* (2023.01)

(52) U.S. Cl.
CPC .... *H01L 23/5226* (2013.01); *H01L 21/76802* (2013.01); *H01L 21/76877* (2013.01); *H01L 23/53266* (2013.01); *H01L 23/53271* (2013.01); *H01L 23/5329* (2013.01); *H10B 12/482* (2023.02)

(58) Field of Classification Search
CPC .......... H01L 23/5226; H01L 21/76802; H01L 21/76877; H01L 23/53266; H01L 23/53271; H01L 23/5329; H01L 21/76847; H01L 21/76897; H01L 23/485; H01L 21/7682; H10B 12/482
See application file for complete search history.

(56) References Cited

U.S. PATENT DOCUMENTS

| 9,548,260 B2 | 1/2017 | Park et al. |
| 11,037,930 B2 | 6/2021 | Park et al. |
| 2020/0388620 A1* | 12/2020 | Park .................... H10B 12/315 |

FOREIGN PATENT DOCUMENTS

TW    I718077 B    2/2021

* cited by examiner

*Primary Examiner* — Jonathan Han
(74) *Attorney, Agent, or Firm* — MUNCY, GEISSLER, OLDS & LOWE, P.C.

(57) ABSTRACT

A semiconductor structure and a method for forming the same are provided. A semiconductor structure includes a substrate, a bit line structure, a first conductive pillar, an interface layer, a second conductive pillar, and an intermediate structure. The substrate has an active area and an isolation structure. The bit line structure is disposed on the active area. The first conductive pillar is disposed on the active area. The interface layer is disposed on a top surface of the first conductive pillar. The second conductive pillar is disposed on the interface layer. The intermediate structure is disposed between the first conductive pillar and the bit line structure.

10 Claims, 7 Drawing Sheets

SEMICONDUCTOR STRUCTURE AND METHOD FOR FORMING THE SAME

CROSS REFERENCE TO RELATED APPLICATIONS

Background

Field of the Invention

The present disclosure relates to a semiconductor structure and a method for forming the same, and, in particular, to a semiconductor structure which may be processed as a memory device and a method for forming the same.

Description of the Related Art

Dynamic Random Access Memory (DRAM) has the advantages of high storage unit density, fast access speed, and low cost, so it is widely used.

However, with the trend of miniaturization of semiconductor devices, the size of memory devices continues to shrink, resulting in increased capacitive coupling between adjacent components or components of interconnect structures, leakage current and/or short-circuit problems Therefore, there are still some problems to be overcome with respect to the semiconductor structures which are used as memory devices after further processing and method of forming the same.

SUMMARY

In view of the above problems, the present disclosure disposes the first conductive pillar, the interface layer, the second conductive pillar and the intermediate structure together as a dielectric plug, so that a risk of short circuits between the dielectric plug and the bit line structure is reduced, thereby improving the electrical characteristics of the semiconductor structure.

For example, the relative positions, the contact area therebetween and/or the types of materials of the first conductive pillar, the interface layer, the second conductive pillar and the intermediate structure may be adjusted to increase the contact area between the first conductive pillar and the second conductive pillar. For example, the current path passing through the dielectric plug changes as the contact area increases, so that the overall resistance of the dielectric plug is reduced. Accordingly, the parasitic capacitance between the bit line structure and the dielectric plug is effectively reduced, thereby reducing the risk of short circuits between the dielectric plug and the bit line structure.

An embodiment of the present disclosure provides a semiconductor structure. The semiconductor structure includes a substrate, a bit line structure, a first conductive pillar, an interface layer, a second conductive pillar, and an intermediate structure. The substrate has an active area and an isolation structure. The bit line structure is disposed on the active area. The first conductive pillar is disposed on the active area. The interface layer is disposed on a top surface of the first conductive pillar. The second conductive pillar is disposed on the interface layer. The intermediate structure is disposed between the first conductive pillar and the bit line structure.

An embodiment of the present disclosure provides a method for forming a semiconductor structure. The method includes forming an active area in a substrate. A plurality of bit line structures is formed on the active area, wherein an opening is between adjacent bit line structures. A dielectric structure is formed in the opening. The active area is etched to form a recess in the opening. A first conductive pillar is formed on the recess. An interface layer is formed on a top surface of the first conductive pillar. A second conductive pillar is formed on the interface layer.

DETAILED DESCRIPTION

Figure 1:
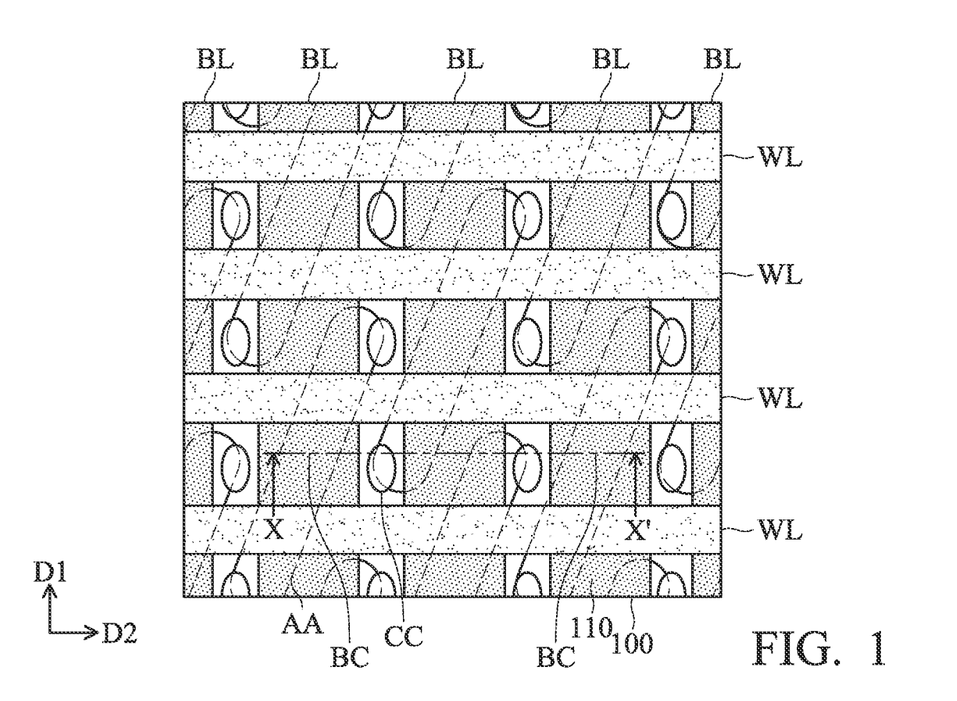
FIG. 1 is a schematic diagram illustrating a circuit layout of a semiconductor structure according to some embodiments of the present disclosure.

Referring to FIG. 1, the semiconductor structure includes a substrate 100, an isolation structure 110, an active area AA, a bit line BL, a word line WL and a storage node contact CC. For the convenience of description, FIG. 1 simply shows the aforementioned features, but the semiconductor structure of the present disclosure may further include other features. Furthermore, the shapes of the aforementioned features are not limited to the shapes shown in FIG. 1, and the dimensions can be adjusted according to the requirements of the process or application.

The first direction D1 and the second direction D2 are different from each other. For example, the first direction D1 and the second direction D2 are perpendicular to each other, but the present disclosure is not limited thereto. For example, the first direction D1 and the second direction D2 may intersect at an angle.

The bit line BL may provide in plural and may be disposed on the substrate 100. Each bit line BL may extend along the first direction D1. Adjacent bit lines BL are arranged at an interval in a second direction D2 different from the first direction D1. The interval between the adjacent bit lines BL may be the same.

The word line WL may provide in plural and may be disposed on the substrate 100. Each word line WL may extend along the second direction D2. Adjacent word lines WL are arranged at an interval in the first direction D1. The interval between the adjacent word lines WL may be the same. In some embodiments, the word line WL may be buried word line. For example, a gate structure of the word line WL may be lower than the top surface of the substrate 100. In other embodiments, the gate structure of the word line WL may not be lower than the top surface of the substrate 100.

The isolation structure 110 may be formed in the substrate 100 to define the range of the active area AA and to electrically separate two adjacent active areas AA from each other. The active area AA may provide in plural and may be formed in the substrate 100. Each active area AA extends along a direction having an angle with the first direction D1. The shape of the active area AA is only an example, and the present disclosure is not limited thereto.

Each active area AA across two word lines WL and across one bit line BL. Each active area AA and the corresponding bit line BL have an overlapping region and non-overlapping regions on both sides of the overlapping region. A bit line contact BC is located in the overlapping region and the storage node contact CC is located in the non-overlapping region. The two storage node contacts CC corresponding to one active area AA are respectively disposed outside the two word lines WL passing through the active area AA. The storage node contact CC may be in contact with the capacitor. In some embodiments, the storage node contact CC in located on the substrate 100. Each storage node contacts CC is located between two adjacent bit lines BL and between two adjacent word lines WL. When each bit line BL across the corresponding word line WL, the bit line contact BC may be used to electrically connect the corresponding region between the two word lines WL.

FIGS. 2 to 14 are schematic cross sectional view taken along the line XX' as shown in FIG. 1.

Figure 2:
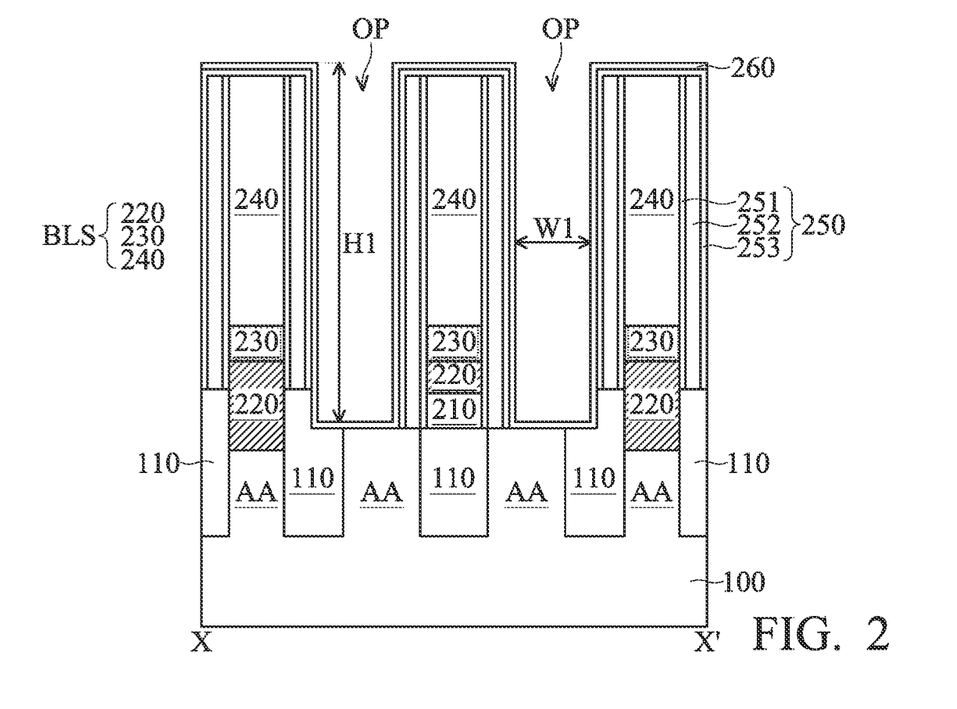
FIGS. 2 to 14 are schematic cross sectional views illustrating the formation of a semiconductor structure at various stages according to some embodiments of the present disclosure.

Referring to FIG. 2, a substrate 100 is provided. The substrate 100 may be a wafer such as a silicon wafer, semiconductor-on-insulation (SOI) substrate or a bulk semiconductor substrate. In some embodiments, the substrate 100 may be a multilayer substrate, a gradient substrate, an element semiconductor; a compound semiconductor, a doped or undoped semiconductor substrate, but the present disclosure is not limited thereto.

As shown in FIG. 2, the active area AA and the isolation structure 110 are formed in the substrate 100. For example, the active area AA is formed in an upper portion of the substrate 100, and then the isolation structure 110 is formed between adjacent active areas AA. In some embodiments, the isolation structure 110 may be formed, and then the active area AA may be formed in the substrate 100. The isolation structure 110 may be an oxide such as silicon oxide. In some embodiments, the isolation structure 110 may be formed by an etching process and a deposition process.

The etching process may include dry etching, wet etching, or other suitable etching methods. The isolation structure 110 may be shallow trench isolation (STI). In addition, required doped regions may be further formed according to the electrical requirements of the semiconductor structure.

A bit line structure BLS is formed on the active area AA. The bit line structure BLS may include a first conductive layer 220, a second conductive layer 230, and a mask layer 240. The first conductive layer 220 is disposed on the active area AA. The second conductive layer 230 is disposed on the first conductive layer 220. The mask layer 240 is disposed on the second conductive layer 230. The first conductive layer 220 and/or the second conductive layer 230 may have a single-layer or multi-layer structure. In some embodiments, the materials of the first conductive layer 220 and the second conductive layer 230 may be sequentially deposited on the substrate 100, and then a patterned mask layer 240 may be formed on the second conductive layer 230. After that, an etching process is performed to pattern the materials of the first conductive layer 220 and the second conductive layer 230 to obtain the first conductive layer 220 and the second conductive layer 230.

The first conductive layer 220 and/or the second conductive layer 230 may include conductive materials. The conductive material may include polycrystalline silicon, amorphous silicon, metals such as tungsten, gold, silver, copper, cobalt or the like, metal nitrides, conductive metal oxides, other suitable materials or a combination thereof. For example, the first conductive layer 220 may include polycrystalline silicon, and the second conductive layer 230 may include tungsten. The mask layer 240 may be a hard mask layer. The material of the mask layer 240 may include oxide, nitride, oxynitride, carbide, or a combination thereof. In some embodiments, the mask layer 240 may be a nitride such as silicon nitride.

As shown in FIG. 2, in some embodiments, a bit line dielectric layer 210 is formed on the isolation structure 110.

In some embodiments, the bit line dielectric layer 210 is formed on the isolation structure 110 before the first conductive layer 220 is formed on the substrate 100. It should be noted that, since FIG. 2 shows a schematic cross sectional view taken along the line XX' in FIG. 1, the bit line dielectric layer 210 is formed on the isolation structure 110 between the middle two active areas AA. The bit line dielectric layer 210 may include oxides, nitrides, oxynitrides, high dielectric constant (high-k) materials, or a combination thereof. In some embodiments, the bit line dielectric layer 210 may include an oxide such as silicon oxide. In some embodiments, the bit line dielectric layer 210 may be an insulating layer. The bit line dielectric layer 210 may be formed by a deposition process. In the present embodiment, the bit line structures BLS located on the leftmost and rightmost active areas AA in FIG. 2 may be electrically connected to the bit line contacts BC in FIG. 1, or the bit line structure BLS may be a portion of the bit line contact BC.

As shown in FIG. 2, a spacer structure 250 may be further formed on a side surface and the top surface of the bit line structure BLS. The spacer structure 250 may provide electric isolation of the bit line structure BLS. The spacer structure 250 may be an oxide, a nitride, or a combination thereof. In some embodiments, the spacer structure 250 may be silicon oxide or silicon nitride.

The spacer structure 250 may be a single layer structure or a multi-layer structure. For example, the spacer structure 250 may include a first spacer 251, a second spacer 252, and a third spacer 253. In some embodiments, the first spacer 251 may be disposed on the side surface of the bit line structure BLS. Specifically, the first spacer 251 is in contact with the isolation structure 110, the first conductive layer 220, the second conductive layer 230, and the mask layer 240. In some embodiments, the first spacer 251 is in contact with the bit line dielectric layer 210. The second spacer 252 may be disposed on a side surface of the first spacer 251, and the first spacer 251 is located between the second spacer 252 and the bit line structure BLS. The third spacer 253 may be disposed on a side surface of the second spacer 252, and the second spacer 252 is located between the first spacer 251 and the third spacer 253. The third spacer 253 may be blanket disposed on the second spacer 252, the first spacer 251 and the mask layer 240.

The spacer structure 250 may be formed by the deposition process and etching process. In some embodiments, the first spacer 251 and the third spacer 253 may include silicon nitride, and the second spacer 252 may include silicon oxide, but the present disclosure is not limited thereto.

A liner 260 may be conformally formed on the active area AA, the isolation structure 110, the spacer structure 250, and the bit line structure BLS. In some embodiments, the liner 260 may be a nitride such as silicon nitride. The liner 260 may be a single layer or multi-layer structure, or the liner 260 may be omitted. The liner 260 may be formed by a deposition process.

As shown in FIG. 2, an opening OP is located between adjacent bit line structures BLS. The opening OP may be formed on the liner 260. The opening OP may be formed corresponding to the shape of the liner 260. FIG. 2 is a schematic cross sectional view taken along the line XX' as shown in FIG. 1, and it shows two openings OP. However, a number of the openings OP is an example, but the present disclosure is not limited thereto. The number of the showed openings OP will change as the different cross sectional views taken along different lines. In some embodiments, the opening OP has a first height H1 and a first width W1.

Hereinafter, the dielectric plug formed in the opening OP and electrically connected to the capacitor will be described in detail.

Figure 3:
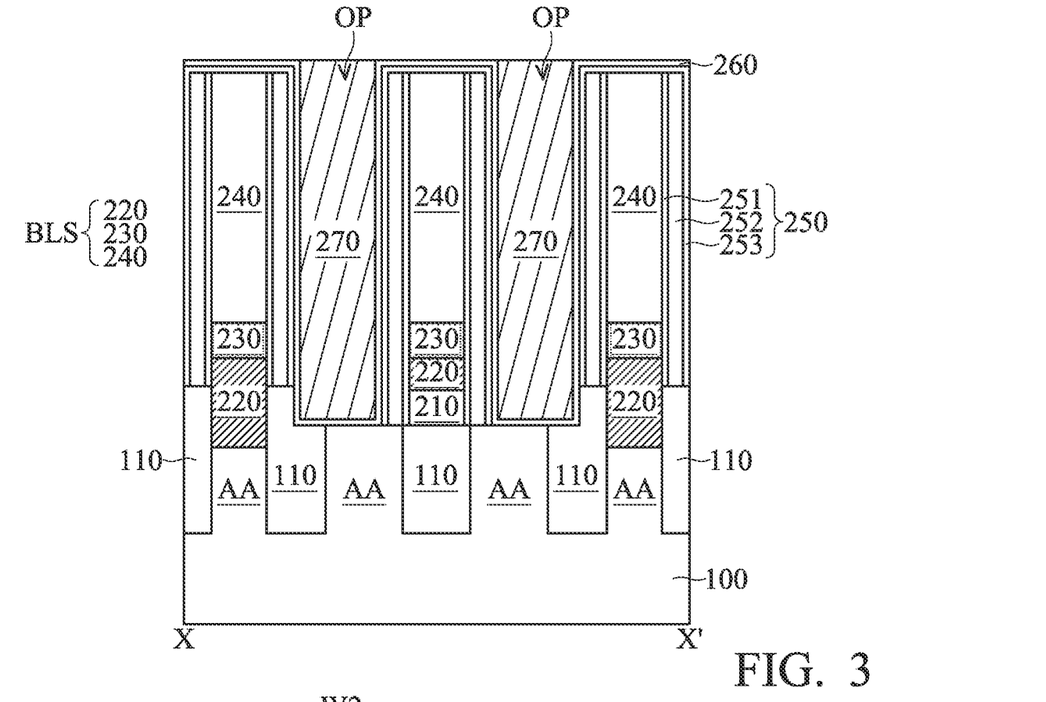

Referring to FIG. 3, a dielectric material 270 may be formed by a deposition process so that the dielectric material 270 is filled in the opening OP. In some embodiments, the opening OP is completely filled with the dielectric material 270. The dielectric material 270 is in contact with a side surface and a bottom surface of the opening OP. The dielectric material 270 may include oxides, nitrides, oxynitrides, carbides, or a combination thereof. In some embodiments, the dielectric material 270 may be silicon oxide.

Figure 4:
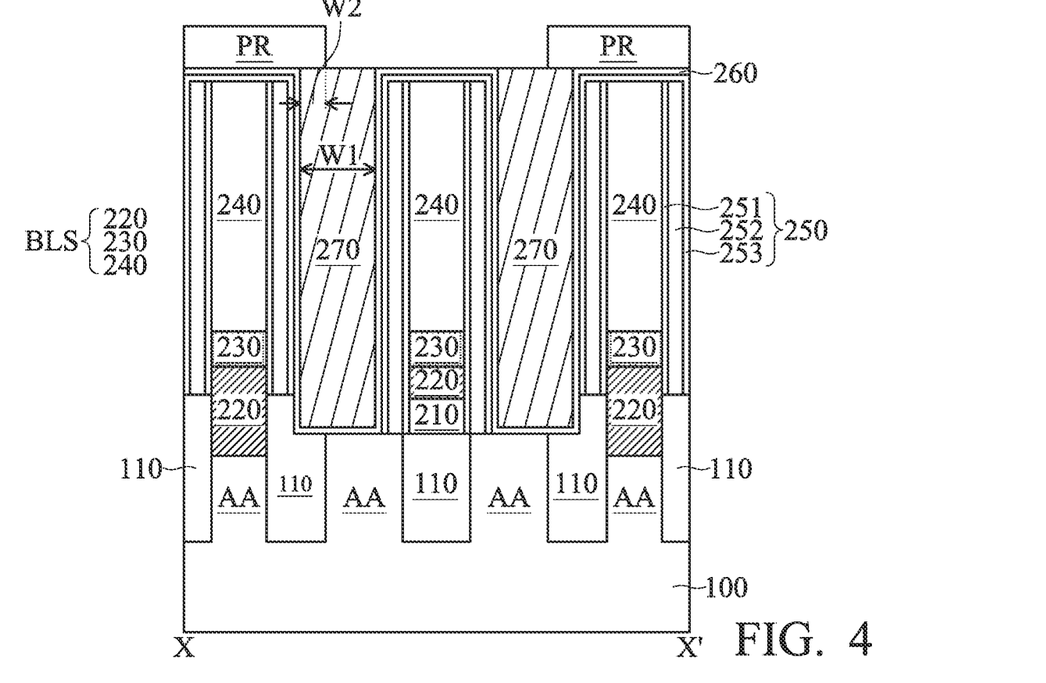

Referring to FIG. 4, a photoresist layer PR is formed on the dielectric material 270. The photoresist layer PR covers the liner 260 and the dielectric material 270. In some embodiments, the photoresist layer PR covers a portion of the dielectric material 270 and exposes another portion of the dielectric material 270. The width of the photoresist layer PR covering the dielectric material 270 is the second width W2. The second width W2 is smaller than the first width W1. In some embodiments, the photoresist layer PR covers 20%, 30%, 40%, 50%, 60%, 70%, 80%, 90% or any combination of the foregoing values of the total area of the top surface of the dielectric material 270. The area ratio of the top surfaces of the dielectric material 270 and the subsequently formed first conductive pillar may be adjusted by the photoresist layer PR. That is, the width of the subsequently formed intermediate structure may be adjusted by the coverage area of the photoresist layer PR.

Figure 5:
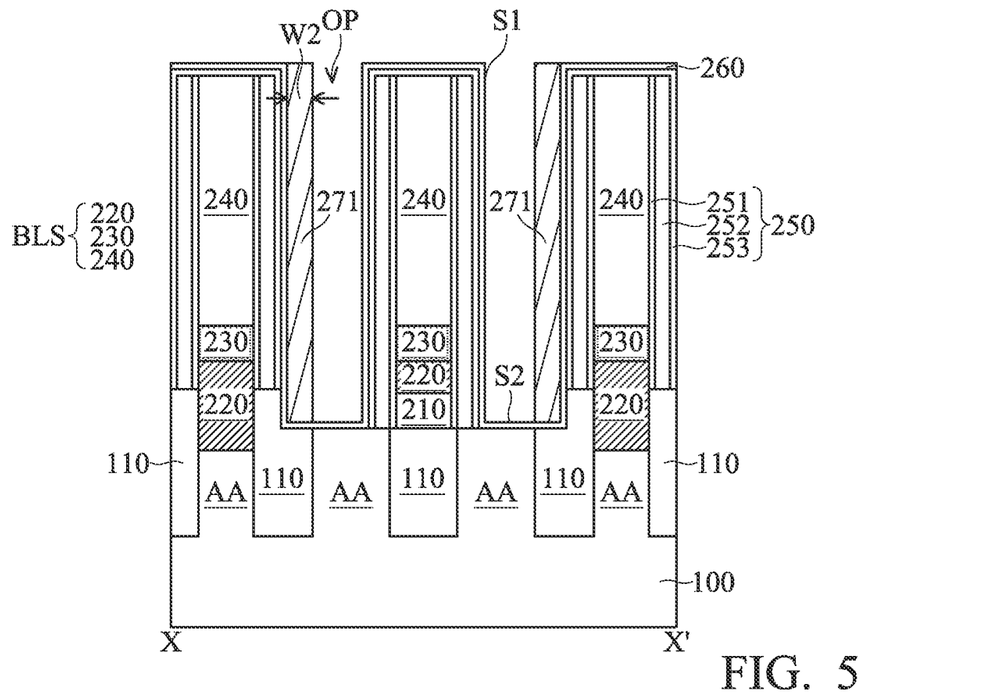

Referring to FIG. 5, the dielectric material 270 is patterned by performing the etching process with the photoresist layer PR as an etching mask, thereby forming a patterned dielectric material 271 and exposing the side surface S1 and the bottom surface S2 of the opening OP. The dielectric material 271 covers one side surface of the opening OP, and exposes the other side surface S1 of the opposite side surfaces. The dielectric material 271 exposes a portion of the bottom surface S2 of the opening OP. The width of the patterned dielectric material 271 is substantially the same as the second width W2. The width of the dielectric material 271 may be adjusted according to electrical requirements. The dielectric material 271 may cover the top surface of the isolation structure 110. In some embodiments, the dielectric material 271 may further cover the top surface of the active area AA. The photoresist layer PR is removed by a removal process such as an ashing process and/or a wet strip process.

Figure 6:
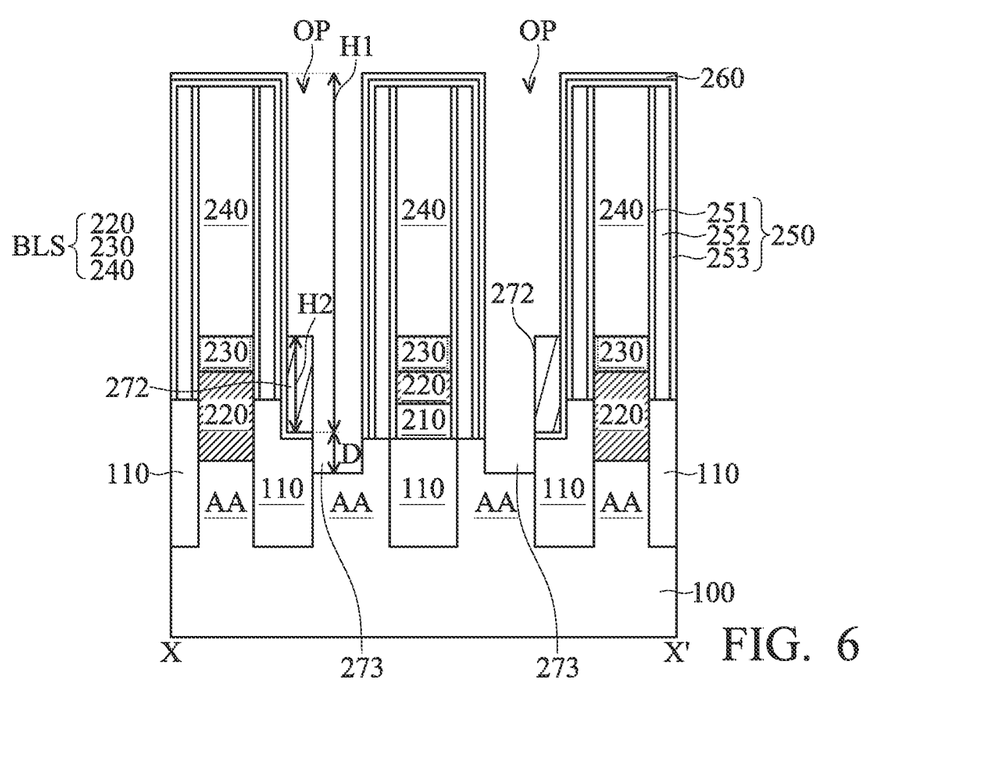

Referring to FIG. 6, a first etching process is performed to reduce the height of the dielectric material 271, such that the top surface of the dielectric material 271 is lower than the top surface of the bit line structure BLS thereby forming a dielectric structure 272 in the opening OP. In some embodiments, the dielectric structure 272 has a second height H2. The second height H2 is smaller than the first height H1. In some embodiments, the height of the dielectric structure 272 is substantially the same as the height of the second conductive layer 230. In other words, the top surfaces of the dielectric structure 272 and second conductive layer 230 are at same level. Since a large parasitic capacitance is easily generated adjacent to the second conductive layer 230, when the height of the dielectric structure 272 is substantially the same as the height of the second conductive layer 230, the parasitic capacitance can be reduced by the dielectric structure 272. The second height H2 of the dielectric structure 272 may be adjusted according to electrical requirements. In some embodiments, the first etching process is an etch-back process. The etch-back depth can be controlled by the etch-back parameters to further control the height of the dielectric structure 272.

As shown in FIG. 6, a second etching process is performed on the active area AA to form a recess 273 in the opening OP. Specifically, the active area AA and a portion of the liner 260 are etched by the second etching process to remove a portion of liner 260 and a portion of the active area AA. Thus, the recess 273 with a depth D is formed. The recess 273 is located between adjacent isolation structures 110. After performing the second etching process, the active area AA is exposed. In some embodiments, the bottom surface of the recess 273 is lower than the top surface of the active area AA. In other embodiments, the second etching process is stopped until the active area AA is exposed. In other words, only the active area AA is exposed without removing a portion of the active area AA.

It should be noted that, performing the second etching process to remove a portion of the active area AA may increase the contact area between the subsequently formed dielectric plug and the active area AA. Specifically, the contact area between the dielectric plug and the active area AA may further include an area that is in contact with the side surface of the active area AA. For example, the side surfaces of the recess 273 in the active area AA can also be in contact with the subsequently formed dielectric plugs. Therefore, by increasing the contact area between the dielectric plug and the active area AA, the current path flowing through the active area AA and the dielectric plug can be adjusted. Thus, a risk of short circuits between the dielectric plug and the bit line structure can be reduced.

Furthermore, in some embodiments, the first etching process for reducing the height of the dielectric material 271 and the second etching process for forming the recess 273 may be performed in the same process. For example, while performing the first etching process to reduce the height of the dielectric material 271, the liner 260 and the active area AA are simultaneously etched by controlling the etching selectivity ratio and the etching parameters. Wherein, the etching selectivity ratio of the materials of the dielectric material 271, the liner 260, and the active area AA is in controlled. Thus, the liner 260 exposed by the dielectric structure 272 is removed and the active area AA is recessed. Therefore, the process cost can be reduced. In other embodiments, the first etching process for reducing the height of the dielectric material 271 and the second etching process for forming the recess 273 may be sequentially performed in different processes.

Figure 7:
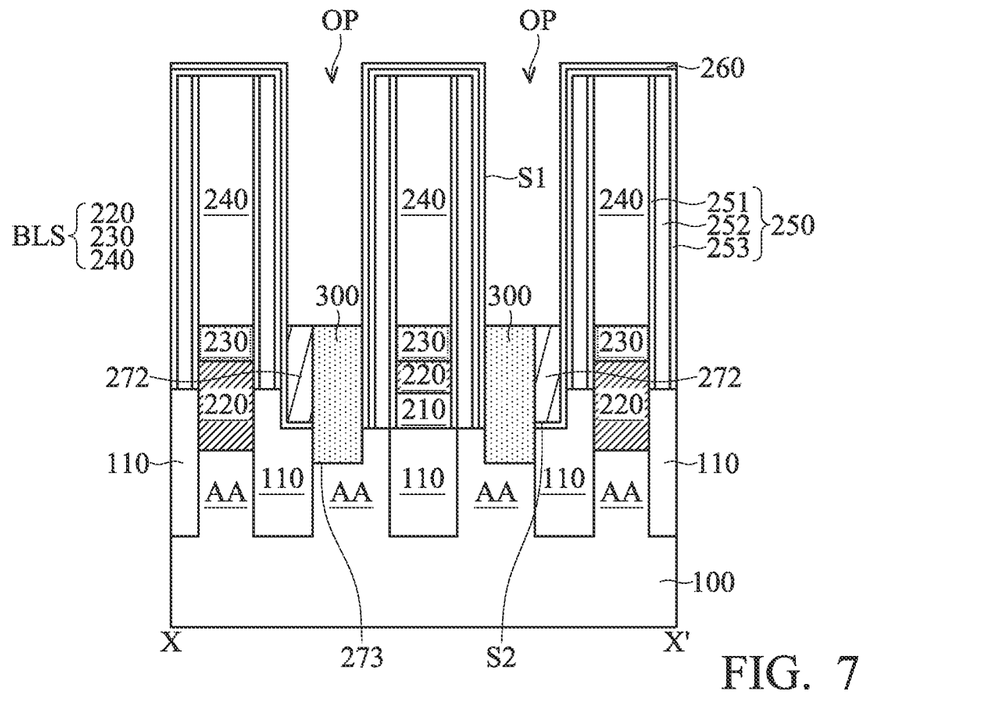

Referring to FIG. 7, a first conductive pillar 300 is formed on the recess 273. A material of the first conductive pillar 300 is blanketly formed in the opening OP, and then the material of the first conductive pillar 300 is removed by an etch-back process. Therefore, the top surface of the first conductive pillar 300 is aligned with the top surface of the dielectric structure 272. The first conductive pillar 300 may include a conductive material which may include polycrystalline silicon, amorphous silicon, metal such as tungsten, gold, silver, copper, cobalt or the like, metal nitride, conductive metal oxide, other suitable materials or a combination thereof. In some embodiments, the first conductive pillar 300 may include polycrystalline silicon.

The first conductive pillar 300 is disposed on the active area AA. The first conductive pillar 300 covers a portion of the exposed side surface S1 of the opening OP. For example, the first conductive pillar 300 covers a lower portion of the side surface S1 of the opening OP, and exposes an upper portion of the side surface S1 of the opening OP. In some embodiments, the first conductive pillar 300 completely covers the exposed bottom surface S2 of the opening OP. In some embodiments, the first conductive pillar 300 is in contact with one of the opposite side surfaces S1 of the opening OP, the dielectric structure 272 is in contact with the other of the opposite side surfaces S1 of the opening OP, and the first conductive pillar 300 is in directly contact with the dielectric structure 272. In some embodiments, the first conductive pillar 300 is in contact with the liner 260, the dielectric structure 272, the isolation structure 110, and the active area AA. In some embodiments, the dielectric structure 272 is located between the first conductive pillar 300 and the bit line structure BLS. In some embodiments, the top surface of the first conductive pillar 300 is a flat surface, so the reliability of the first conductive pillar 300 can be improved. In some embodiments, the shape of the first conductive pillar 300 may not be limited to a pillar shape.

Figure 8:
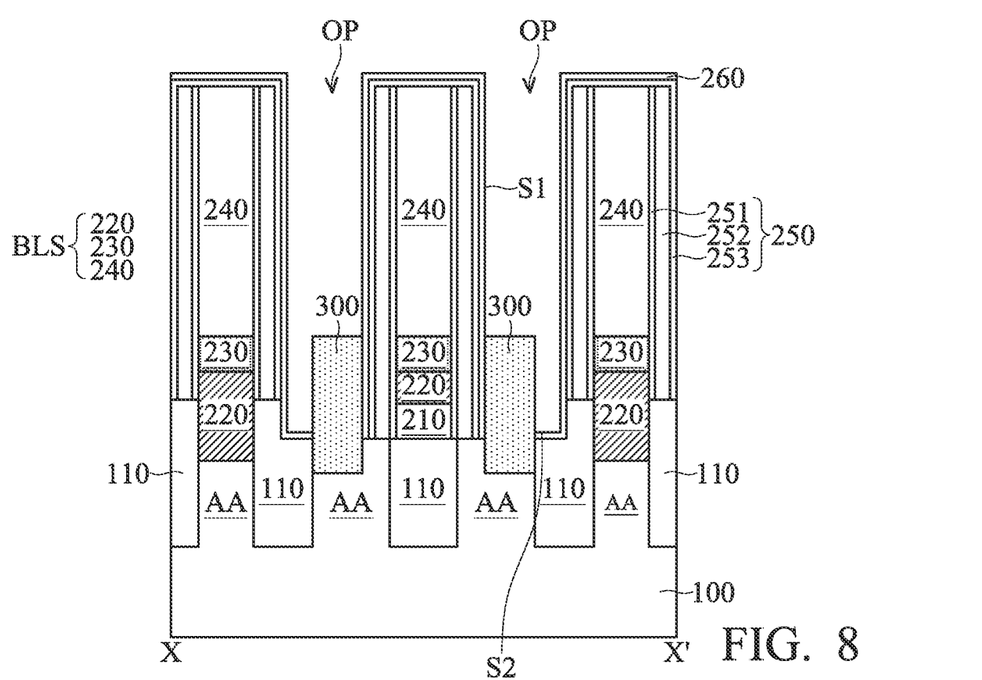

Referring to FIG. 8, the dielectric structure 272 is removed by an etching process to expose the side surface and bottom surface of the opening OP between the first conductive pillar 300 and the bit line structure BLS. In some embodiments, the dielectric structure 272 may be removed by a wet etching process with the first conductive pillar 300 as an etching mask.

Figure 9:
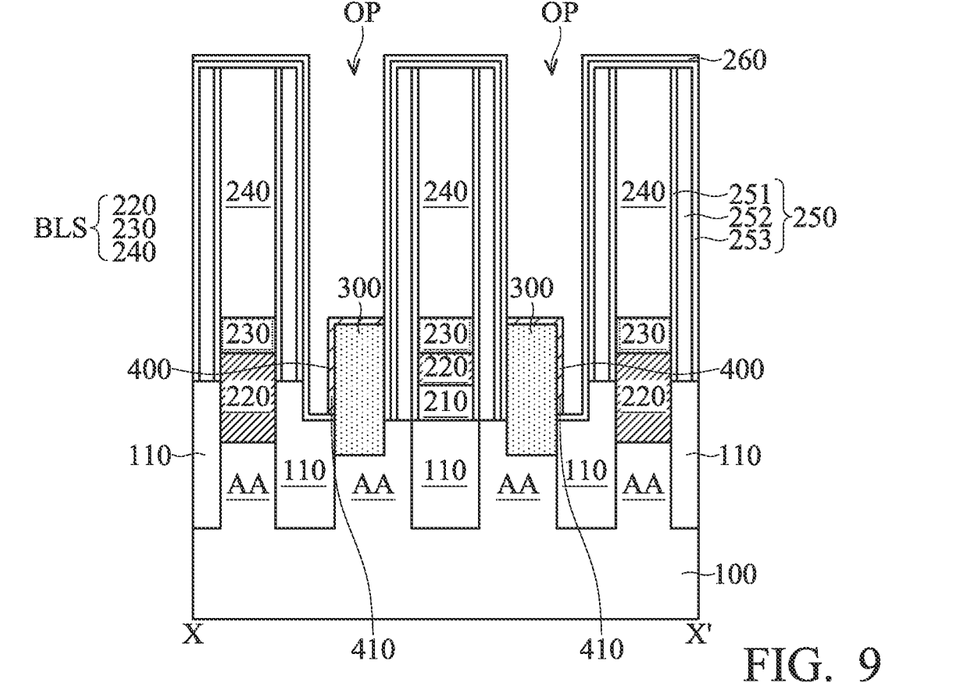

Referring to FIG. 9, after removing the dielectric structure 272, an interface layer 400 is formed on the top surface of the first conductive pillar 300. In some embodiments, the interface layer 400 is conformally formed on the top surface and the side surface of the first conductive pillar 300. In other words, the interface layer 400 may include an extending portion 410 which may be disposed on the side surface of the first conductive pillar 300. In some embodiments, the extending portion 410 may be located between the first conductive pillar 30) and the bit line structure BLS. In some other embodiments, the interface layer 400 may be formed on the top surface of the first conductive pillar 300, and the interface layer 400 may cover at least a portion of the side surface of the first conductive pillar 300. In other embodiments, the interface layer 400 may be formed on the top surface of the first conductive pillar 300, and the interface layer 400 may completely expose the side surface of the first conductive pillar 300. In the semiconductor structure of the present disclosure, the factors that have a greater influence on the resistance include the contact area between the first conductive pillar 300 and the active area AA. Thus, in the case where the interface layer 400 is formed at least on the top surface of the first conductive pillar 300, the semiconductor structure of the present disclosure can be effectively operated. In some embodiments, the interface layer 400 may be a crutch shape, an inverted L shape, or other suitable shape.

The interface layer 400 may be used as a buffer layer for improving compatibility, in order to improve the reliability of the dielectric plug of the subsequently formed semiconductor structure. In some embodiments, the interface layer 400 may include cobalt silicide, so that the interface layer 400 can improve the compatibility between the first conductive pillar 300 and the second conductive pillar subsequently formed on the interface layer 400, so as to improve the reliability of the overall dielectric plug.

Figure 10:
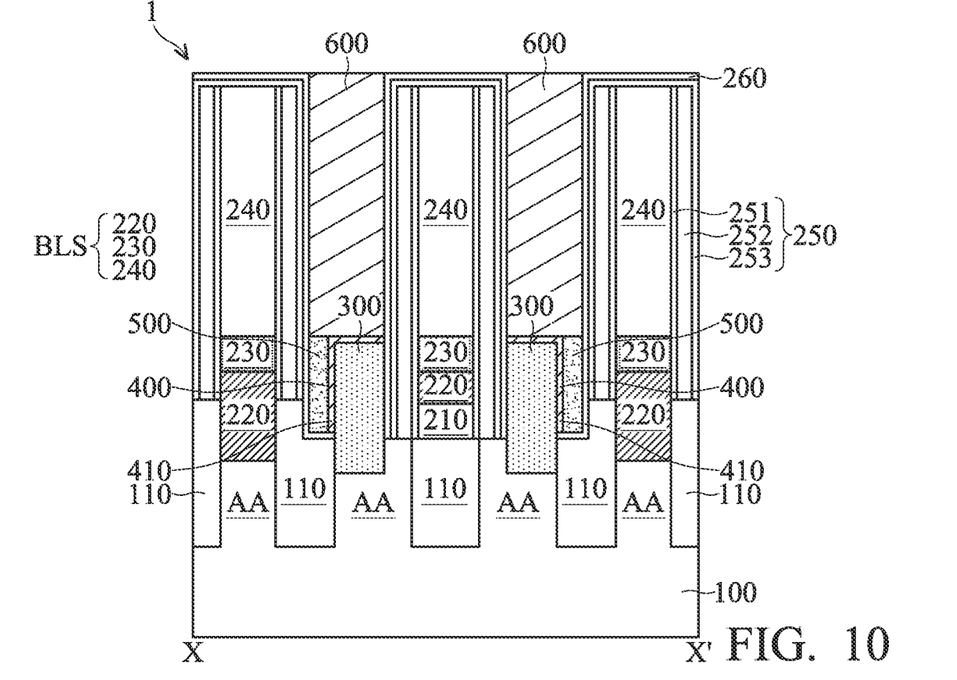

Referring to FIG. 10, a second conductive pillar 600 is formed on the interface layer 400 to obtain the semiconductor structure 1 of the present disclosure. The materials and forming methods used to form the second conductive pillar 600 may be the same or different from that used to form the first conductive pillar 300. In some embodiments, the second conductive pillar 600 includes tungsten.

As shown in FIG. 10, an intermediate structure 500 may be formed under the second conductive pillar 600. In some embodiments, the intermediate structure 500 is disposed between the first conductive pillar 300 and the bit line structure BLS. In some embodiments, the top surface of the intermediate structure 500 may be aligned with the top surface of the interface layer 400. In some embodiments, the materials and forming methods used to form the intermediate structure 500 are the same or different from that used to form the second conductive pillar 600.

In some embodiments, the material of the intermediate structure 500 is the same as the material of the second conductive pillar 600. In some embodiments, both the intermediate structure 500 and the second conductive pillar 600 are tungsten. For example, a material is blanketly deposited on the liner 260 and the interface layer 400 so that the intermediate structure 500 and the second conductive pillar 600 are simultaneously formed. Next, a planarization process is performed to make the top surface of the second conductive pillar 600 be aligned with the top surface of the liner 260. In other words, the intermediate structure 500 and the second conductive pillar 600 may be integrally formed. In some embodiments, the planarization process may include chemical mechanical polishing (CMP) process, but the present disclosure is not limited thereto. In some embodiments, after removing the dielectric structure 272, the intermediate structure 500 and the second conductive pillar 600 are integrally formed in the opening OP shown in FIG. 9.

In some embodiments, when the materials of the intermediate structure 500 and the second conductive pillar 600 are blanketly deposited, an aspect ratio of a trench between the liner 260 and the extending portion 410 of the interface layer 400 may be adjusted by adjusting the second width W2 shown in FIG. 5 and the second height H2 shown in FIG. 6. Therefore, deposition parameters and deposition profiles of the materials of the intermediate structure 500 and the second conductive pillar 600 may be adjusted by adjusting the aspect ratio of the trench. In some embodiments, the materials of the intermediate structure 500 and the second conductive pillar 600 completely fills the trench between the liner 260 and the extending portion 410 of the interface layer 400. In other words, the intermediate structure 500 is surrounded by the liner 260, the extending portion 410 of the interface layer 400, and the second conductive pillar 600. In some embodiments, when a central axis of the second conductive pillar 600 is used as a symmetry axis, the present disclosure provides a dielectric plug with an asymmetric structure.

In this embodiment, the extending portion 410 of the interface layer 400 is between the intermediate structure 500 and the first conductive pillar 300. In some embodiments, the intermediate structure 500 is located between the extending portion 410 and the bit line structure BLS. The intermediate structure 500 is located between the extending portion 410 and the liner 260. The bottom surface of the first conductive pillar 300 is lower than the bottom surface of the intermediate structure 500. Therefore, the contact area between the first conductive pillar 300 and the intermediate structure 500 and the second conductive pillar 600 can be increased. Accordingly, the current path flowing through the overall dielectric plug is adjusted by disposing the intermediate structure 500, thereby reducing the risk of short circuits between the dielectric plug and the bit line structure BLS. For example, the risk of short circuits between the first conductive pillar 300 and the first conductive layer 220 and/or the second conductive layer 230 in the bit line structure BLS is reduced.

In other embodiments, the material of the intermediate structure 500 is different from that of the second conductive pillar 600. In this embodiment, the intermediate structure 500 may be formed, and then the second conductive pillars 600 may be formed.

FIG. 10 is a schematic cross sectional view taken along a line XX' in FIG. 1. In this cross-sectional view, line XX' laterally across five isolation structures 110 and four active areas AA in the second direction D2 shown in FIG. 1, wherein the four active areas AA are located between the five isolation structures 110 respectively. In this case, the bit line dielectric layer 210 and the bit line structure BLS is disposed on the isolation structure 110 in the middle, so that the integration of the bit line dielectric layer 210 and the bit line structure BLS can be regarded as a dummy bit line structure. In other words, FIG. 10 shows a schematic cross sectional view of one dummy bit line structure between two adjacent bit line structures BLS. In FIG. 10, the intermediate structure 500 is disposed adjacent to the bit line structure BLS and away from the dummy bit line structure. In some embodiments, the intermediate structure 500 and the first conductive pillar 300 are located between the bit line structure BLS and the dummy bit line structure. Wherein, compared to the first conductive pillar 300, the intermediate structure 500 is closer to the bit line structure BLS. Taking a central axis of the dummy bit line structure as the symmetry axis, the first conductive pillar 300, the interface layer 400, the intermediate structure 500, and the second conductive pillar 600 may be symmetrically disposed. In other words, when the central axis of the dummy bit line structure is used as the symmetry axis, the present disclosure provides a symmetrical structure.

Figure 11:
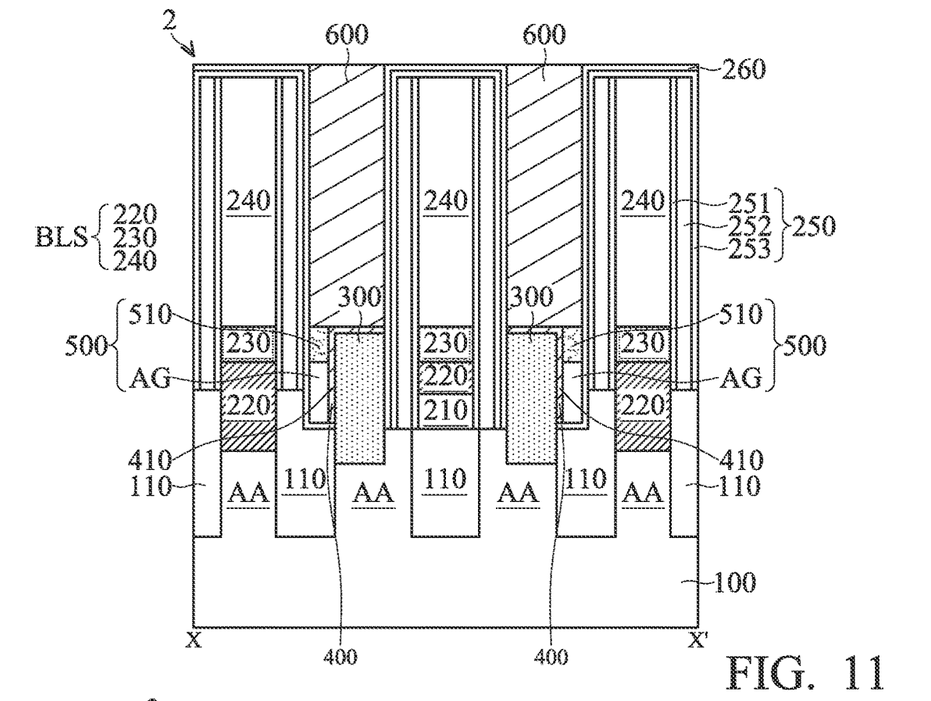

Referring to FIG. 11, a schematic cross sectional view of the semiconductor structure 2 of the present disclosure is shown. For convenience of description, similar and repeated descriptions are omitted. FIG. 11 is a schematic cross sectional view of a semiconductor structure which is the semiconductor structure shown in FIG. 9 after further processing. As shown in FIG. 11, a second conductive pillar 600 is formed on the interface layer 400 to obtain the semiconductor structure 2 of the present disclosure. In this embodiment, the deposition profile of the blanket deposited material of the intermediate structure 500 is changed by adjusting the aspect ratio of the trench between the liner 260 and the extending portion 410 of the interface layer 400.

In this embodiment, an intermediate component 510 is formed under the second conductive pillar 600, and an air gap AG is formed under the intermediate component 510. The material of the intermediate structure 500 is deposited in the opening OP shown in FIG. 9, such that the bottom surface of the material of the intermediate structure 500 is between the top surface and bottom surface of the interface layer 400. For example, the bottom surface of the material of the intermediate structure 500 may be between the top surface of the interface layer 400 and the bottom surface of the extending portion 410.

In some embodiments, the material of the intermediate component 510 and the material of the second conductive pillar 600 may be the same, such as tungsten. In other words, the intermediate component 510 and the second conductive pillar 600 are integrally formed. For example, the material of the second conductive pillar 600 is blanketly deposited to simultaneously form the second conductive pillar 600 and the intermediate structure 500 including the intermediate component 510 and the air gap AG. In other words, the material of the second conductive pillar 600 is blanketly deposited to partially fill the trench between the liner 260 and the extending portion 410 of the interface layer 400 with the material of the second conductive pillar 600, thereby forming the air gap AG.

In some embodiments, the intermediate component 510 and the air gap AG may be regarded as the intermediate structure 500 as a whole. In some embodiments, the area of the intermediate structure 500 respectively occupied by the intermediate component 510 and the air gap AG may be adjusted according to the aspect ratio of the trench and the parameters of the deposition process. In some embodiments, the area of the intermediate structure 500 occupied by the intermediate component 510 may be smaller than, substantially equal to, or greater than the area of the intermediate structure 500 occupied by the air gap AG. In some embodiments, the top surface of the air gap AG may be lower than or aligned with the top surface of the first conductive pillar 300 or the interface layer 400. In some embodiments, the intermediate component 510 is in contact with the first conductive pillar 300, the interface layer 400, and the second conductive pillar 600.

The air gap AG may include an inert gas, air, or be in a vacuum state. Since the intermediate structure 500 may include the air gap AG disposed under the intermediate component 510, the parasitic capacitance can be effectively reduced, thereby reducing the risk of short circuits between the dielectric plug and the bit line structure BLS.

Figure 12:
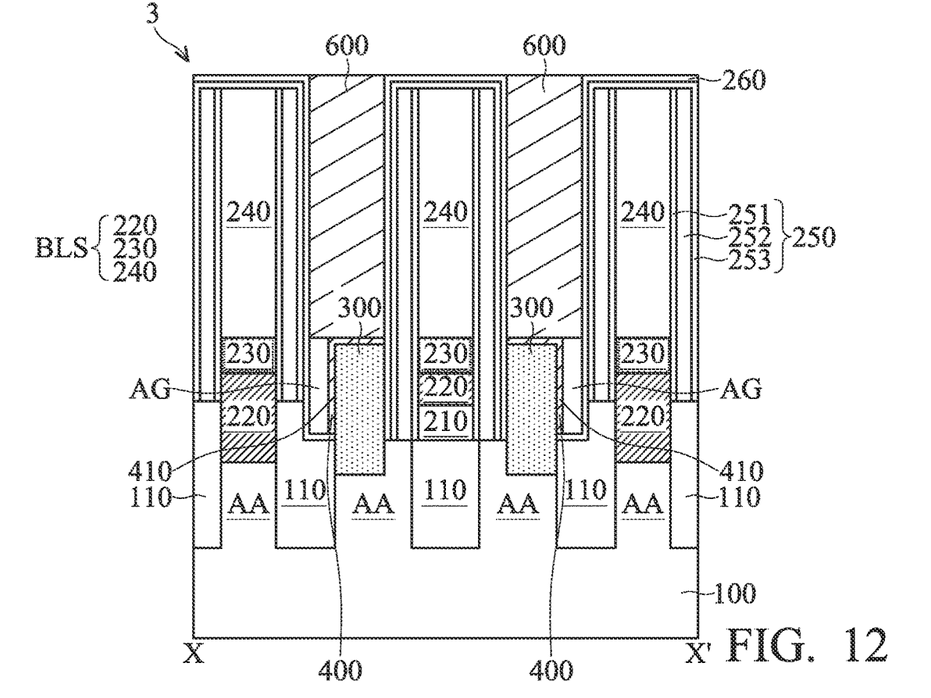

Referring to FIG. 12, a schematic cross sectional view of the semiconductor structure 3 of the present disclosure is shown. For convenience of description, similar and repeated descriptions are omitted. FIG. 12 is a schematic cross sectional view of a semiconductor structure which is the semiconductor structure shown in FIG. 9 after further processing. As shown in FIG. 12, a second conductive pillar 600 is formed on the interface layer 400 to obtain the semiconductor structure 3 of the present disclosure. The bottom surface of the second conductive pillar 600 is aligned with the top surface of the interface layer 400, and the air gap AG is formed under the second conductive pillar 600. In some embodiments, the air gap AG is in directly contact with the second conductive pillar 600. In this embodiment, the air gap AG can be regarded as the intermediate structure. Therefore, in the case where the intermediate structure is substantially the air gap AG, the parasitic capacitance between the first conductive pillar 300 and the bit line structure BLS can be effectively reduced, thereby reducing the risk of short circuits.

Figure 13:
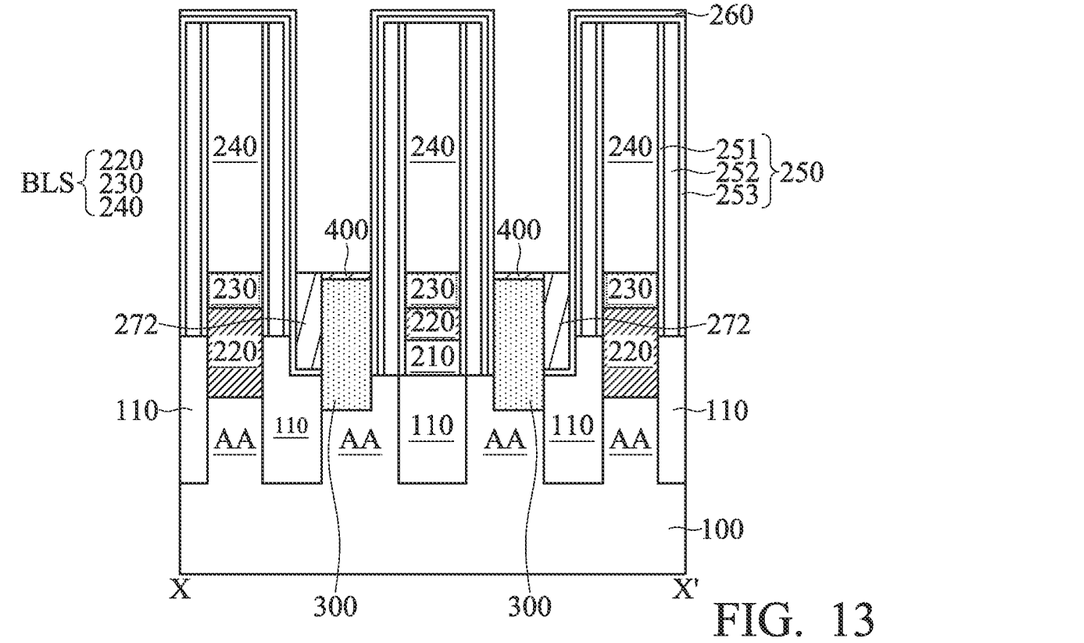

Referring to FIG. 13, a schematic cross sectional view of a semiconductor structure according to another embodiment of the present disclosure is shown. For convenience of description, similar and repeated descriptions are omitted. For convenience of description, similar and repeated descriptions are omitted. FIG. 13 is a schematic cross sectional view of a semiconductor structure which is the semiconductor structure shown in FIG. 7 after further processing. As shown in FIG. 13, the interface layer 400 is formed on the top surface of the first conductive pillar 300. In some embodiments, the interface layer 400 may include cobalt silicide, and the dielectric structure 272 may include silicon oxide. In this embodiment, the dielectric structure 272 is left between the first conductive pillar 300 and the bit line structure BLS, so as to omit the process steps of removing the dielectric structure 272 and/or further forming the intermediate structure, thereby reducing the process cost. In some embodiments, the interface layer 400 may be formed by polycrystalline silicon of the first conductive pillar 300, so the top surface of the interface layer 400 is aligned with the top surface of the dielectric structure 272.

Figure 14:
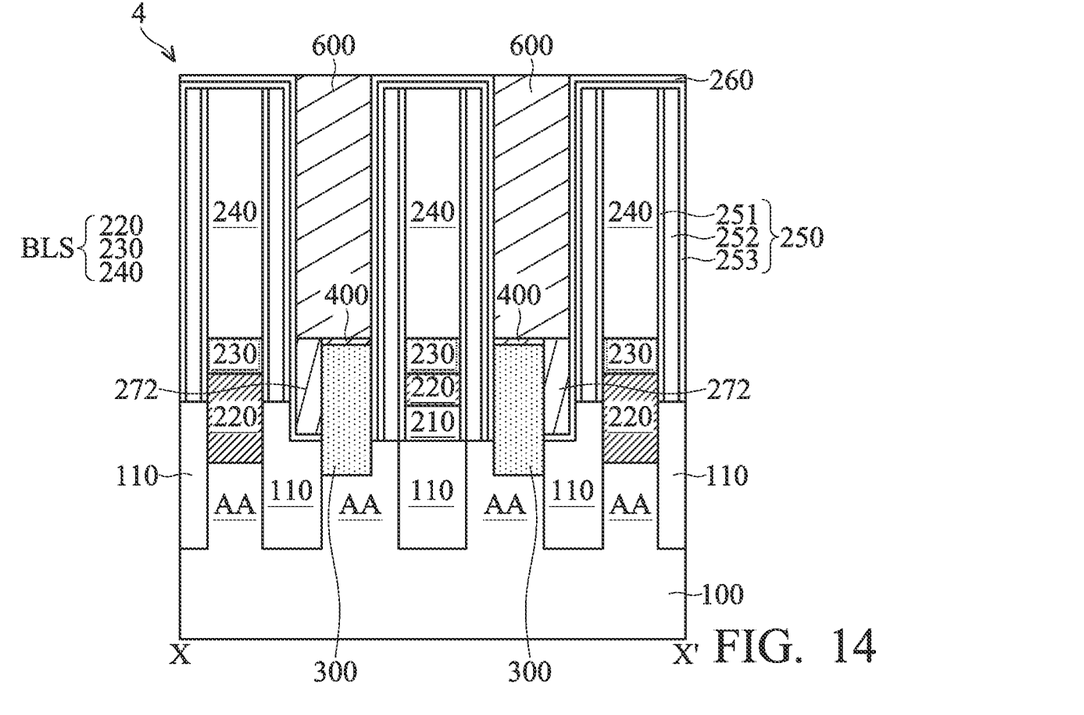

As shown in FIG. 14, a second conductive pillar 600 is formed on the structure shown in FIG. 13, to obtain the semiconductor structure 4 of the present disclosure. In some embodiments, the second conductive pillar 600 is in contact with the interface layer 400 and the dielectric structure 272. The bottom surface of the second conductive pillar 600 is aligned with the top surfaces of the interface layer 400 and the dielectric structure 272. In this embodiment, the dielectric structure 272 can be regarded as the intermediate structure. Since the dielectric structure 272 can be used as an etching mask in the aforementioned process and can be used as the intermediary structure disposed between the first conductive pillar 300 and the bit line structure BLS, the steps of the process can be reduced and the process cost can be reduced. In addition, since the dielectric structure 272 may include a dielectric material such as silicon oxide, the parasitic capacitance can be reduced, thereby reducing the risk of short circuits between the first conductive pillar 300 and the bit line structure BLS.

In some embodiments, further processes may be performed on the semiconductor structures 1, 2, 3 and/or 4 of the present disclosure to form memory devices. For example, in some embodiments, a doping process may be performed according to electrical requirements. In some embodiments, the dopant may be a P-type dopant such as boron or an N-type dopant such as phosphorus.

In summary, the semiconductor structure of the present disclosure includes the first conductive pillar, the interface layer, the second conductive pillar and the intermediate structure as a dielectric plug for connecting capacitors in a memory device.

In the present disclosure, the intermediate structure with the same material as the second conductive pillar is disposed between the first conductive pillar and the bit line structure. The intermediate structure may be regarded as an extending portion of the second conductive pillar, so that the contact area of the second conductive pillar and the first conductive pillar may be increased, thereby reducing the risk of short circuits between the first conductive pillar and the bit line structure. The present disclosure disposes the intermediate structure between the first conductive pillar and the bit line structure to reduce the parasitic capacitance of the dielectric plug, wherein the intermediate structure includes an air gap or is the air gap. Thus, a risk of short circuits between the first conductive pillar and the bit line structure is reduced. The present disclosure disposes the intermediate structure including a dielectric material such as silicon oxide between the first conductive pillar and the bit line structure to reduce the parasitic capacitance of the dielectric plug and/or steps of the process. Thus, a risk of short circuits between the first conductive pillar and the bit line structure is reduced and the process cost of the forming method is reduced.

In addition, the present disclosure increases the contact area between the first conductive pillar and the second conductive pillar and/or the intermediate structure by disposing the first conductive pillar with a bottom surface lower than the second conductive pillar and the intermediate structure. Therefore, the risk of short circuits can be reduced by adjusting the current path flowing through the first conductive pillar, the second conductive pillar and the intermediate structure. Furthermore, the present disclosure improves the compatibility of the first conductive pillar and the second conductive pillar by providing an inverted L-shaped interface layer, so as to improve the reliability of the first conductive pillar and the second conductive pillar. Meanwhile, the present disclosure provides a semiconductor structure with a dummy bit line structure between adjacent bit line structures, so when viewed in this cross sectional direction, a semiconductor structure symmetrical along the dummy bit line structure can be obtained. Accordingly, the short-circuit risk is reduced by disposing the intermediate structure far from the dummy bit line structure and adjacent to the bit line structure.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for changing, substituting, replacing and/or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a substrate having an active area and an isolation structure;
 a bit line structure disposed on the active area;
 a first conductive pillar disposed on the active area;
 an interface layer disposed on a top surface of the first conductive pillar;
 a second conductive pillar disposed on the interface layer; and
 an intermediate structure disposed between the first conductive pillar and the bit line structure,
 wherein the interface layer completely covers a top surface of the first conductive pillar.

2. The semiconductor structure as claimed in claim 1, wherein a bottom surface of the first conductive pillar is lower than a bottom surface of the intermediate structure.

3. The semiconductor structure as claimed in claim 1, wherein the interface layer has an extending portion, and the extending portion is disposed on a side surface of the first conductive pillar.

4. The semiconductor structure as claimed in claim 3, wherein the extending portion is between the first conductive pillar and the intermediate structure.

5. The semiconductor structure as claimed in claim 1, wherein a top surface of the interface layer is level with a top surface of the intermediate structure.

6. The semiconductor structure as claimed in claim 1, wherein the intermediate structure further comprises:
 an intermediate component disposed below the second conductive pillar; and
 an air gap disposed below the intermediate component.

7. The semiconductor structure as claimed in claim 6, wherein the intermediate component is in contact with the interface layer, the second conductive pillar, and the air gap.

8. The semiconductor structure as claimed in claim 1, wherein the intermediate structure is an air gap.

9. The semiconductor structure as claimed in claim 1, wherein the intermediate structure is in contact with the first conductive pillar, the interface layer, and the second conductive pillar.

10. The semiconductor structure as claimed in claim 1, wherein the first conductive pillar comprises polycrystalline silicon, the interface layer comprises cobalt silicide, and the second conductive pillar comprises tungsten.

* * * * *